US011374477B2

(12) United States Patent
Villaret et al.

(10) Patent No.: US 11,374,477 B2
(45) Date of Patent: Jun. 28, 2022

(54) PULSE GENERATOR HARVESTING ENERGY FROM A MOVING ELEMENT

(71) Applicant: Servosense (SMC) Ltd., Petach-Tikva (IL)

(72) Inventors: Yves Villaret, Hadera (IL); Alex Matskin, Kfar-Saba (IL); Nadav Reinberg, Hod-HaSharon (IL)

(73) Assignee: Servosense (SMC) Ltd., Petach-Tikva (IL)

( * ) Notice: Subject to any disclaimer, the term of this patent is extended or adjusted under 35 U.S.C. 154(b) by 351 days.

(21) Appl. No.: 16/489,701

(22) PCT Filed: Mar. 8, 2018

(86) PCT No.: PCT/IL2018/050277
§ 371 (c)(1),
(2) Date: Aug. 29, 2019

(87) PCT Pub. No.: WO2018/163186
PCT Pub. Date: Sep. 13, 2018

(65) Prior Publication Data
US 2019/0386554 A1 Dec. 19, 2019

Related U.S. Application Data

(60) Provisional application No. 62/469,110, filed on Mar. 9, 2017.

(51) Int. Cl.
*H02K 35/02* (2006.01)
*H02K 11/215* (2016.01)
(Continued)

(52) U.S. Cl.
CPC ............ *H02K 35/02* (2013.01); *G01D 5/244* (2013.01); *G01P 3/487* (2013.01); *G01R 33/07* (2013.01);
(Continued)

(58) Field of Classification Search
CPC .... H02K 11/215; H02K 11/22; H02K 11/225; H02K 35/02; G01D 5/244; G01P 3/487; G01R 33/07; G06M 1/274; H03K 17/95
(Continued)

(56) References Cited

U.S. PATENT DOCUMENTS 4,093,906 A * 6/1978 Draxler ................. F02B 61/045
310/43
4,319,151 A 3/1982 Klotz
(Continued)

FOREIGN PATENT DOCUMENTS

CN 101918798 12/2010
CN 101999079 3/2011
(Continued)

OTHER PUBLICATIONS

Notification of Office Action and Search Report dated Nov. 6, 2020 From the State Intellectual Property Office of the People's Republic of China Re. Application No. 201880030531.1 and Its Translation of Office Action Into English. (11 Pages).
(Continued)

*Primary Examiner* — Rashad H Johnson

(57) ABSTRACT

A pulse generator comprises a mounting to hold two bodies in proximity to each other. Two magnetic elements may be movably placed in the mounting, and the magnetic elements will align with each other in one of two stable states. A coil surrounds the magnetic elements in the mounting, and a force application device applies a force to the first magnetic element to cause the first magnetic element to break the current alignment and thereby make the first and second magnetic elements realign to the other stable state. The movement of the magnets generates a pulse in the coil which may be detected by suitable circuitry and used. The device may be used inter alia to count rotations or linear move-
(Continued)

ments, or to provide switching or remote control without the need for a separate power source.

22 Claims, 8 Drawing Sheets

(51) Int. Cl.
| | |
|---|---|
| H02K 11/225 | (2016.01) |
| G01D 5/244 | (2006.01) |
| G01P 3/487 | (2006.01) |
| G01R 33/07 | (2006.01) |
| G06M 1/274 | (2006.01) |
| H03K 17/95 | (2006.01) |

(52) U.S. Cl.
CPC .......... *G06M 1/274* (2013.01); *H02K 11/215* (2016.01); *H02K 11/225* (2016.01); *H03K 17/95* (2013.01)

(58) Field of Classification Search
USPC .............................. 310/12.12, 12.14, 24, 25
See application file for complete search history.

(56) References Cited

U.S. PATENT DOCUMENTS

| | | | |
|---|---|---|---|
| 5,714,882 | A | 2/1998 | Mehnert et al. |
| 6,160,322 | A | 12/2000 | Gotoh et al. |
| 8,242,649 | B2* | 8/2012 | Fradella ................ F16C 25/083 318/599 |
| 2006/0056575 | A1 | 3/2006 | Mehnert et al. |
| 2009/0179505 | A1* | 7/2009 | Hoppe ................ H02K 41/033 310/12.17 |
| 2011/0304220 | A1 | 12/2011 | Whitehead |
| 2014/0246961 | A1 | 9/2014 | Smith |
| 2015/0008768 | A1* | 1/2015 | Achterberg ............ B65G 54/02 310/12.11 |
| 2015/0028699 | A1* | 1/2015 | Hofstetter .............. H02K 41/02 310/12.31 |
| 2016/0359401 | A1 | 12/2016 | Deak, Sr. |

FOREIGN PATENT DOCUMENTS

| | | |
|---|---|---|
| CN | 102334263 | 1/2012 |
| CN | 103493347 | 1/2014 |
| GB | 2230123 | 10/1990 |
| WO | WO 2018/163186 | 9/2018 |

OTHER PUBLICATIONS

Notification of Office Action dated May 7, 2021 From the State Intellectual Property Office of the People's Republic of China Re. Application No. 201880030531.1 and Its Translation Into English. (10 Pages).

Supplementary European Search Report and the European Search Opinion dated Nov. 12, 2020 From the European Patent Office Re. Application No. 18764806.8. (9 Pages).

International Search Report and the Written Opinion dated Jun. 28, 2018 From the International Searching Authority Re. Application No. PCT/IL2018/050277. (12 Pages).

Communication Pursuant to Article 94(3) EPC dated Feb. 25, 2022 From the European Patent Office Re. Application No. 18764806.8. (5 Pages).

* cited by examiner

PULSE GENERATOR HARVESTING ENERGY FROM A MOVING ELEMENT

RELATED APPLICATION/S

This application is a National Phase of PCT Patent Application No. PCT/IL2018/050277 having International filing date of Mar. 8, 2018, which claims the benefit of priority under 35 USC § 119(e) of U.S. Provisional Patent Application No. 62/469,110 filed Mar. 9, 2017. The contents of the above applications are all incorporated by reference as if fully set forth herein in their entirety.

FIELD AND BACKGROUND OF THE INVENTION

The invention relates to a pulse generator that harvests energy from a moving element, and more generally to devices that produce electrical pulses due to the displacement of a moving member without the need of a power supply or battery.

An example of such a device is a Wiegand wire, for example described in US Patent 006191687B1 by Dlugos et al. In this example, the Wiegand wire is able to produce a pulse each time a magnetic field of alternating direction is applied. The energy of each pulse may then activate an electronic circuit to count the occurrence of the pulse and accumulate the results in a non-volatile memory.

Another example of a Wiegand wire application is described in U.S. Pat. No. 8,283,914 B2 by Mehnert et al. In this patent, the Wiegand wire pulse is used to determine the position of a shaft or a linear moving element.

Another type of pulse generator is described in U.S. Pat. No. 6,628,741 B2 by Netzer. In this patent, a reed relay is placed in a magnetic field, and the resulting contact between two ferro-magnetic components creates a changing magnetic field and a pulse in a surrounding coil.

In all the above mentioned pulse generator types, the electrical pulses are very short and the amount of energy produced by the electrical pulses are extremely small. For example available Wiegand wires are able to produce around 10 Nano Coulomb at 5 Volt, corresponding to a usable power of 1.25 micro-watt. The design of an electronic circuit activated by such a small energy requires specially designed electronic devices. Thus a disadvantage of these devices is that they require the development of an expensive and specific electronic interface for the particular application.

Another type of pulse generator is described in U.S. Pat. No. 8,461,830 B2 by Villaret. In this patent, an electrical pulse is produced by the movement of a small core of magnetizable material inside a coil, the movement being caused by the approach of a permanent magnet. This type of generator is able to produce electrical pulses of higher energy. For example a pulse generator for an encoder can produce 20 Micro Coulombs at 5 volts, corresponding to a usable power of 50 micro-watts.

However this generator has certain mechanical complexity, requiring a precisely manufactured and mounted spring and a magnetizable core. In addition, a relatively strong force or torque is required on the moving element. In the case of application as a motor feedback device (encoder), the force or torque perturbation has to be removed during normal operation of the feedback device. For this purpose, a blocking mechanism is also needed, adding complexity and cost.

Furthermore, a mechanical stopper is required to stop the moving core after entering the coil. The impact of the core on the mechanical stopper requires a carefully designed damping material and limits the life time of the device.

SUMMARY OF THE INVENTION

It is an object of the present invention to provide a pulse generator of simple and robust design harvesting its energy from the moving element and able to produce an amount of energy scalable to the application needs.

Embodiments of the present invention may provide two separate magnetic elements that align with each other in two stable states. When forced out of one of the stable states they may realign to the other stable state, the movement involved in the realignment generating an electrical pulse in a surrounding coil or winding.

The two magnetic elements may be rotatable, and may rotate between two opposite positions in which their poles are aligned.

The present device includes magnetic elements, which may typically be permanent magnets, of appropriate shape that are confined in cavities and organized in a bi-stable arrangement, i.e. in an arrangement with two different stable states. In the absence of an external force, say from a magnetic field, intermediate positions have higher potential energy, so that the device remains in the same stable state. For the purpose of producing an electrical pulse, while the device is in a given first stable state, a force, for example a magnetic field, is progressively applied that tends to move the device toward the second stable state, i.e. raises the potential energy of the present position and reduces the potential energy to reach the second stable state. Whenever the device reaches a transiting position of highest potential energy, that is as soon as it passes the top of the energy barrier, then the device elements start accelerating toward the second stable state. By the law of magnetics, and Earnshaw's theorem, the attractive force towards the second stable state increases rapidly as the magnetic elements approach it, until it is mechanically stopped by the cavity walls, or magnetically stopped by the rising potential energy as it overshoots and reaches the following energy barrier.

The result is thus an abrupt transition movement from the first stable state to the second stable state. This abrupt movement causes a rapidly changing magnetic field.

A coil may surround the magnetic elements of the device, and the above mentioned rapidly changing magnetic field may induce an electrical pulse in the coil.

By applying magnetic fields in alternating directions, the device may then produce electrical pulses of alternating sign. This may for example be achieved by bringing permanent magnets from different directions towards the device.

According to one aspect of the present invention there is provided a pulse generator comprising:

a mounting configured to hold two bodies in proximity to each other;

first and second magnetic elements movably held in said mounting, such that the magnetic elements align with each other in a first alignment in one of two stable states;

a coil surrounding said magnetic elements in said mounting;

a force application device for applying a force to said first magnetic element, said force being such as to cause said first magnetic element to break said first alignment and cause said first and second magnetic elements to realign in said second stable state, thereby to generate a pulse in said coil.

In an embodiment, said force application device is configured to provide a magnetic field which is misaligned with said first magnetic element, thereby applying said force.

In an embodiment, said force application device comprises a third magnetic elements.

In an embodiment, said first, second and third magnetic elements are respectively permanent magnets.

In an embodiment, each of said two stable states comprises an opposite magnetic field orientation, and wherein intermediate positions between said two stable states have higher potential energy than the potential energy of the stable positions.

In an embodiment, the force application device is configured to progressively apply said magnetic field to said first magnetic element.

In an embodiment, the magnetic elements comprise a row of at least two magnetic balls confined in at least one cavity in said mounting, and wherein in both stable positions each magnetic ball aligns magnetically with a neighboring magnetic ball in said row.

An embodiment may place a plurality of magnetic balls in said row in successive odd and even positions, and wherein the two stable positions are:
a) a north magnetic hemisphere of a respective ball at an odd row position facing a south magnetic hemisphere of a ball at an even row position; and
b) a south magnetic hemisphere of a ball at an odd row position facing a north hemisphere of a ball at an even row position.

In an embodiment, the magnetic elements comprise an ordered row of at least two magnetic cylinders magnetized across their length and confined in at least one cavity, and in both stable positions each magnetic cylinder aligns with a neighboring magnetic cylinder in said row.

In an embodiment, a plurality of said magnetic cylinders in said row may take up successive odd and even positions. The two stable positions may be:
a) a north magnetic half of a cylinder in an odd row position facing a south magnetic half of a cylinder at an even row position; and
b) a south magnetic half of a cylinder at an odd row position facing a north magnetic half of a cylinder at an even row position.

Embodiments may comprise a counter, wherein the coil is connected to said counter to enable said counter to count and store a number of pulses.

Embodiments may comprise a transmitter, wherein the coil is connected to said transmitter to transmit a signal in response to one or more of said pulse.

The pulse generator may be within a remote controller, said signal being configured to cause operation of a remotely located device.

The pulse generator may be within an Internet of Things device, said signal being configured for a local radio network.

In an embodiment, the force application device is part of a rotating element, such that said pulse generator counts rotations of said rotating element.

In an embodiment, said force application device comprises two oppositely aligned magnets circumferentially separated on said rotating element.

The pulse generator may be combined with a second pulse generator aligned with said force application device.

Embodiments may comprise a single turn encoder to measure the angular position of the rotating element, so that the pulse generator obtains the number of turns and as appropriate the quarter turn position, and the encoder obtains the precise current angular position.

In an embodiment, said force application device is part of a measurement system for measuring linear movement of a moving element along a track.

In an embodiment, said force application device comprises a plurality of magnets evenly spaced along said linear moving element.

In an embodiment, said force application device comprises a plurality of magnets evenly spaced along said track.

In an embodiment, said plurality of magnets are of alternating polarity.

Embodiments may comprise an electronic interface operated by said electric pulse.

In an embodiment, at each electrical pulse the electronic interface is configured to carry out the actions of:
a) reading from a memory a previously stored position of the moving element;
b) calculating an increment or decrement;
c) updating a current position of the element; and
d) storing the current position of the element.

A device for measuring rotation of a shaft may comprise the pulse generator as described above, and a rotating shaft. The force application device may then be located on said rotating shaft to generate pulses in accordance with rotation of said rotating shaft.

In an embodiment, said force application device comprises two oppositely aligned magnets circumferentially separated on said rotating shaft.

Embodiments may include a second pulse generator aligned with said force application device.

Embodiments may comprise a single turn encoder to measure the angular position of the rotating shaft.

Another device for measuring linear motion of a moving part on a track comprises the pulse generator as described above, wherein the mounting is located on said moving part and said force application device comprises a plurality of alternately polarized magnets evenly spaced along said track.

In embodiments, the force application device comprises a rotatable disk surface facing said mounting.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
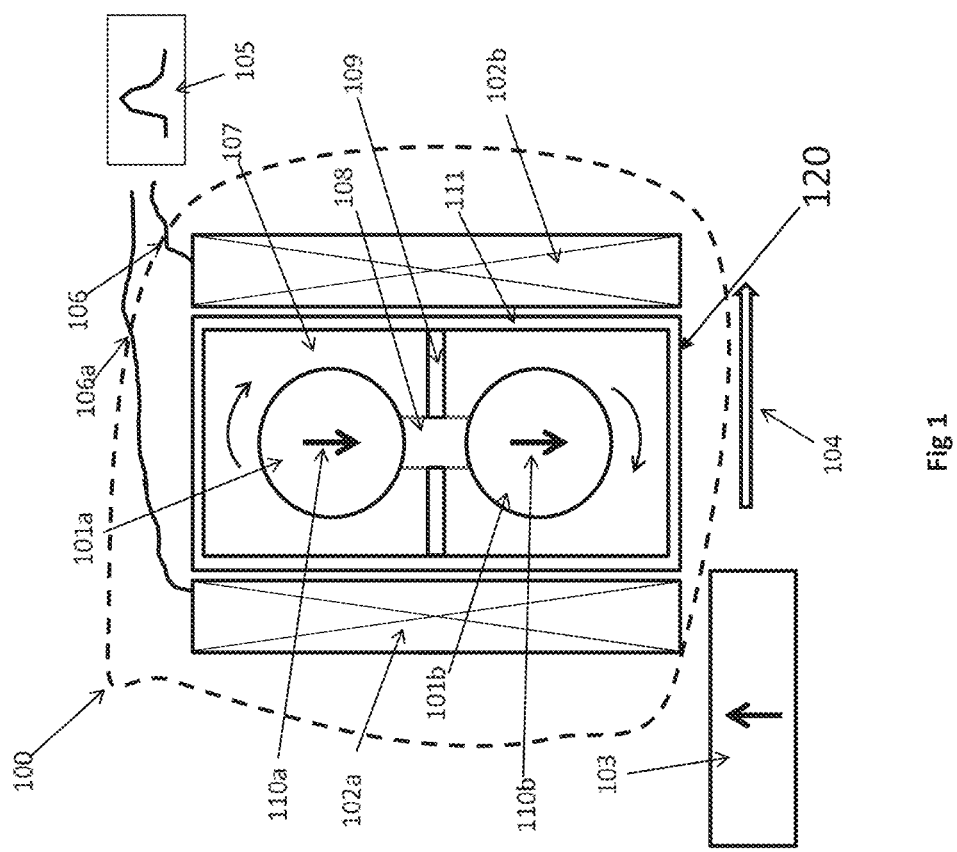
FIG. 1 illustrates an embodiment of the pulse generator of the present invention with two magnetic balls or cylinders.

The invention relates to a pulse generator that harvests energy from a moving element, and more generally to devices that produce electrical pulses due to the displacement of a moving member without the need of a power supply or battery.

A pulse generator comprises a mounting to hold two bodies in proximity to each other, and first and second magnetic elements movable in the mounting. The magnetic elements align with each other in a first alignment in one of two stable states and a coil surrounds the magnetic elements in the mounting. A force application device applies a force to the first magnetic element to cause the first magnetic element to break the first alignment and make the two magnetic elements realign to the second stable state. The movement of the magnets generates a pulse in the coil which can be detected and can energize connected circuitry and no separate electrical power source is needed. The device may be used inter alia to count rotations or linear movements, or to provide switching or remote control, as will be explained in greater detail below.

In a simplified embodiment, the device includes two magnetic balls enclosed in two cavities, separated by a non-magnetic spacing element or spacer. The two magnetic balls attract each other, so that they have two stable states. In a first stable state, the magnetic north hemisphere of the first ball faces the south hemisphere of the second ball. In a second stable state, the south hemisphere of the first ball faces the north hemisphere of the second ball.

While the device is in a first state, if a permanent magnet pole progressively approaches the hemisphere of same polarity of one of the balls in the pair, then the approached ball will be repulsed and will tend to rotate, however the attraction by the other ball prevents this rotation until the repulsion becomes stronger than the attraction by the other ball. At this moment, both balls will abruptly rotate to align their magnetic field with that of the approaching permanent magnet and reach the second stable state.

A first advantage of the present embodiments is that it is scalable. The proposed device can be designed with a size calculated for a required pulse energy. By contrast, Wiegand devices are available only for small wires. Whenever a larger amount of energy is required, then Wiegand cannot be used.

A device according to the present embodiments may be used as a remote control that does not require batteries, or may be used for switching IoT devices where it is hard to provide battery power. The movement of a command button pressed or turned is transferred to an exciting magnet in proximity to the pulse generator. When the command button is pressed, the exciting magnet changes its position and flips over the orientation of the magnetic field in the pulse generator, thus activating a pulse. The energy of the pulse generator is then used in any way needed, for example to transmit a coded radio signal to the relevant appliance.

A second advantage of the present embodiments is its mechanical simplicity. Ball can be contained in small cavities provided in plastic material, into which the coil may be embedded.

A third advantage of the present embodiments is that there is no hard mechanical impact. Each ball rotates; there is no strong translating movement. Standard plastic materials similar to those used in ball bearing can be used to confine the magnetic balls at their position.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 is a simplified drawing showing a cross section of a device according to an embodiment of the present invention.

Pulse generator 100 comprises a mounting 120 made up of a cavity 107 and cavity wall 111, which is designed to hold two bodies in proximity to each other. The two bodies in question are first and second magnetic elements 101a and 101b which are movably held in the mounting. The magnetic elements have poles, and like poles repel whereas opposite poles attract, so that the two magnets align. There are two stable ways in which the magnets can align, either with both north poles upwards or with both north poles downwards. Arrows 110a and 110b indicate the alignment, with the arrowheads indicating the north pole. Any misalignment quickly leads to the magnets getting back to the closest of the two stable states.

A coil shown by its two cross section 102a, 102b, surrounds the magnetic elements in the mounting.

A force application device 103 applies a force to the first magnetic element 101b. The force can be mechanical or magnetic and may be sufficient to misalign the first magnet 101b sufficiently that on being released it causes the second to rotate. That is to say the current magnetic alignment is broken and a sharp movement is caused as the magnets attempt to re-enter a stable state. Typically the alignment is reversed although this is not essential. The movement of the magnets as they attempt to reenter a stable state causes a small electrical pulse to be generated in the coil.

More particularly, two magnetic balls or cylinders 101a and 101b are confined in a cavity 107 and separated by a spacer 108 fixed to the cavity wall 111 by fixation elements such as 109.

Although parts 101a and 101b are here shown as magnetic balls, it is to be understood that the magnets may be of any shape that can move between two stable positions in the confines of a mounting. For example a magnetic cylinder may be used in a similar arrangement.

The two magnetic balls 101a and 101b attract each other and remain in the stable state where both balls magnetic fields are in the same direction shown by arrows 110a and 110b.

A coil, here shown in two sections 102a and 102b, surrounds the cavity 107 and the balls 101a and 101b. The coil comprises a winding with two ends 106a and 106b, from which the resulting pulses may be tapped by external equipment.

The force application device is here shown by way of example as permanent magnet 103, having a magnetic field direction opposite to that of the magnetic balls. Thus the magnet 103 provides a magnetic field which is misaligned with that of the two magnets. It will be noted that the pole to be provided by magnet 103 varies depending on which of the two steady states the magnetic balls are in.

The magnet 103 is made to move in the direction shown by arrow 104, thus approaching the lower of the magnetic balls 101b. Whenever the distance between magnet 103 and ball 101b falls below a certain value, then the two balls 101a and 101b abruptly rotate to align their magnetic field with the magnetic field of the magnet 103. This abrupt rotation results in an abrupt change in the magnetic field inside the coil 102a-102b, and thus in an electrical pulse at the wire ends 106a and 106b.

The amplitude and energy of the electrical pulse can be adjusted to the application needs by design of the ball sizes, the separation distance, the number and geometry of the coil windings, the presence or absence of an iron core, and selection of magnet 103.

Figure 2:
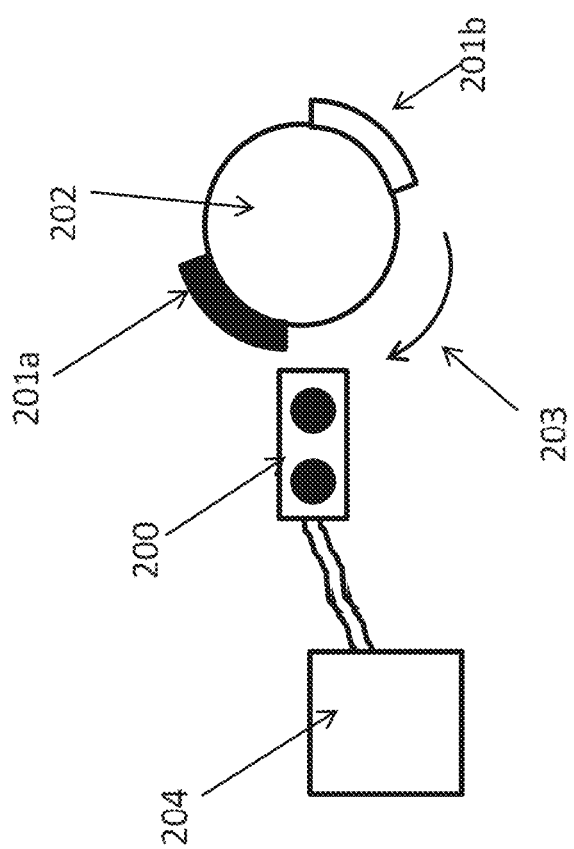
FIG. 2 illustrates an embodiment for counting the number of rotation of shaft turning in a fixed direction.

Reference is now made to FIG. 2, which is a simplified schematic diagram showing how the device of FIG. 1 may be used to count rotations of a shaft. A pulse generator 200 according to the present embodiments counts the revolutions of a shaft 202 turning in a given direction. Two magnets 201a and 201b are fixed to the shaft 202. Magnets 201a and 201b are radially magnetized and present opposite polarities North and South at their outer surface. When the shaft 202 rotates, magnets 201a and 201b alternatively get in proximity to pulse generator 200. Pulse generator 200 then outputs electrical pulses of alternating polarity, which are picked up by electronic circuit 204. The electronic circuit may comprise a non-volatile memory device and a processor. Upon receiving an electric pulse, the electronic circuit 204 is activated by the electrical energy of the pulse and increments a value. For example the circuit may a) read a previously stored counting value from the non-volatile memory, b) increase the counting value and c) store back the new increased counting value in the non-volatile memory. In the present embodiment, there are two electrical pulses for each revolution of the shaft. The embodiment of FIG. 2 may be used as a counter for example in water meters, anemometers and other turning or rotary devices. The counting values are stored in memory without the need of a battery, so that the present embodiments are useful for turning or rotary devices that are installed in remote locations, and which are hard to service and replace batteries. The electronic circuit 204 may have a communication interface, so that the counting value may be read by a host computer when needed.

Figure 3:
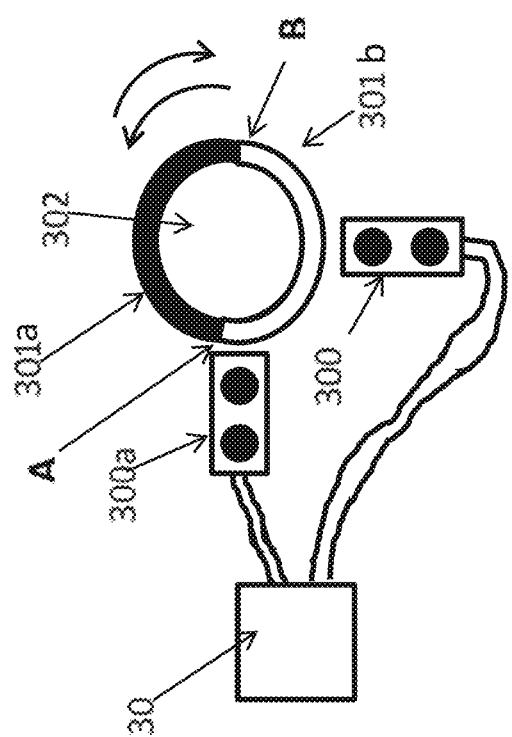
FIG. 3 illustrates an embodiment for registering the multi-turn position of a shaft turning in either direction.

Reference is now made to FIG. 3, which is a schematic diagram illustrating an embodiment of a shaft revolution counter able to determine the quarter turn position of a shaft. The position may be obtained to greater accuracy by integrating from the quarter turn position, and may be able to obtain an absolute angular position of the shaft. The turns are counted as before so that the count may include the cumulative number of turns, and the result may be provided as an integral of the angular velocity from a fixed time origin. In the embodiment of FIG. 3, two magnets of opposite polarity 301a and 301b are fixed to a shaft 302. Magnet 301a is radially magnetized and presents a north pole at its outer surface. Magnet 301b is radially magnetized and presents a south pole at its outer surface. Both magnets 301a and 301b cover nearly the half perimeter of the shaft and show two joining positions A and B. Two pulse generators 300a and 300b, of the kind shown in FIG. 1, are placed in proximity to the shaft at a 90 degree angle with respect to each other, and both are connected to an electronic counter 304. During rotation of shaft 302, the magnets 301a and 301b are alternately in proximity to pulse generators 300a and 300b, thus causing the pulse generator to output electrical pulses. The occurrence of an electrical pulse at a given pulse generator combined with the sign of the last pulse at the other pulse generator gives the information about whether positions A or B have passed either of the pulse generators and in which direction, thus defining the shaft position to the resolution level of a quarter of a turn. Four quarter positions of the shaft 302 ordered in a counter clockwise direction can be defined as follow:

Quarter Position 1: position A is in proximity of pulse generator 300a

Quarter Position 2: position A is in proximity of pulse generator 300b

Quarter Position 3: position B is in proximity of pulse generator 300a

Quarter Position 4: position B is in proximity of pulse generator 300b

Whenever either of positions A and B passes in proximity to a pulse generator, an electrical pulse is generated in that pulse generator. The pulse has a sign which depends on the rotation direction, for example positive if transiting from south to north as per the magnet outer surface.

As an example, the following table can be used to determine the shaft position upon pulse occurrence.

| Pulse generator at which a pulse occurs | Sign of last pulse of other pulse generator | Quarter position |
| --- | --- | --- |
| 300a | Positive | 1 |
| 300b | positive | 2 |
| 300a | negative | 3 |
| 300b | negative | 4 |

At each occurrence of a pulse, the electronic interface reads from the non-volatile memory the last calculated multi-turn position, the last quarter position and the sign of the last pulse of each pulse generator. Then it calculates a new multi-turn position by an increment I and stores the sign of the pulse in the non-volatile memory, along with the new quarter position and the new multi-turn position. The new quarter position is deduced from the above table.

The increment I calculation procedure is as follows:

The difference D between the last two quarter positions is evaluated:

D=(new quarter position)−(previous quarter position)

Then there are three cases to consider:

If (absolute(D)=1) then (I=D/4)

if (D=3) then (I=−¼)

if (D=−3) then (1=¼)

Other procedures to calculate the multi-turn position using the same embodiment may be apparent to the skilled person, such as calculating fractions based on the detected rotation rate, and the above procedure is shown as an example.

The embodiment of FIG. 3 may thus be used to continuously register the multi-turn position of the shaft 302, without needing an external power supply or battery. The embodiment of FIG. 3 may be advantageously used in combination with a conventional powered single turn encoder to implement a high resolution encoder. A conventional single turn encoder is able to provide a high resolution angular position value of the shaft, but it cannot evaluate the number of turns executed by the shaft while it is powered off. Combining the embodiment of FIG. 3, a multi-turn position of high resolution can be calculated by combining the number of turns with high resolution single turn position data. At power on, the encoder gets the multi-turn position from the electronic interface 304 and adds the one turn high resolution information to obtain a high resolution multi-turn position data.

Figure 4:
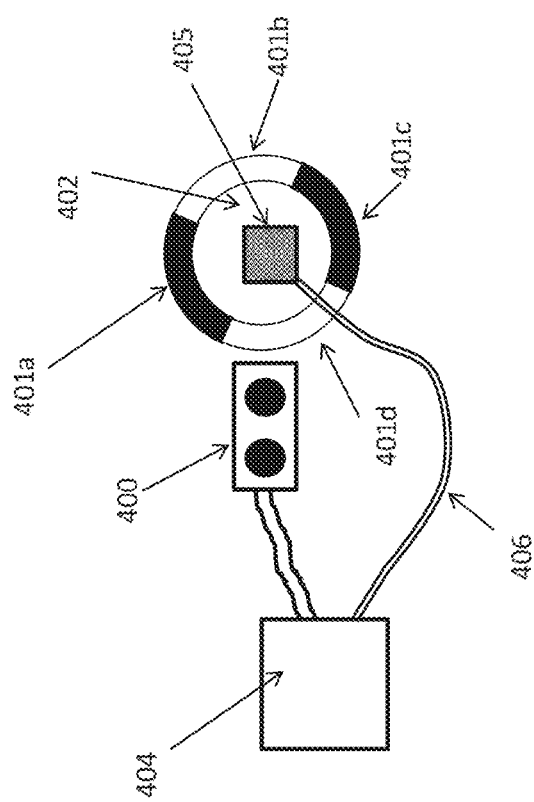
FIG. 4 illustrates another embodiment combined with a single turn encoder for registering the multi-turn position of a shaft turning in either direction.

FIG. 4 is a schematic drawing of a multi-turn position registration using pulse generators according to FIG. 1 and a single turn encoder. A single turn encoder 405, schematically shown, is able to provide the shaft 402 angular position with at least a half turn resolution. There exist several manufacturers of such encoders. Some of these encoders use a magnet fixed on the shaft and a plurality of hall sensors to sense the magnetic field orientation produced by the magnet. Magnets are fixed to the shaft, so that the magnetic field produced by the magnet also rotates, and the orientation of the magnetic field reveals the angular position of the shaft 402. Other available single turn encoders can be used in the scope of the embodiment of FIG. 4.

Four magnets, 401a to 401d are fixed to the shaft with alternating polarities. Magnets 401a and 401b present a north pole at their outer surface, magnets 401b and 401d present a south pole at their outer surface. A pulse generator 400 of the kind shown in FIG. 1, is placed in proximity to the magnets and is connected to an electronic interface 404 including a non-volatile memory. Upon rotation of the shaft, there are four positions at which the polarity of the magnet in proximity to the pulse generator 400 transits from north to south or south to north. These transitions, as explained above, produce an electrical pulse which is transmitted to the electronic interface 404. Upon occurrence of each pulse, the electronic interface retrieves from a non-volatile memory a previously registered multi-turn position a, reads from the single turn encoder 405 the angular position of the shaft θ, and updates the multi-turn position according to the following procedure:

a) calculate angular position of previously recorded multi-turn position:

$\theta1 = modulo(\alpha, one\_turn)$ b) evaluate the shaft angular movement from last pulse occurrence:

$\delta = \theta - \theta1$ c) Select direction if ($\delta$>half_turn) $\delta = \delta$-half_turn if ($\delta$<-half_turn) $\delta = \delta$+half_turn d) Update multi-turn position:

if ($\delta$>0) $\alpha = \alpha + \frac{1}{4}$ if ($\delta$<0) $\alpha = \alpha - \frac{1}{4}$ Thus, the combination of one pulse generator 400 with a single turn encoder provides a registration of the multi-turn position of the shaft without any external power requirement.

The single turn encoder may be of low resolution. A possible requirement is that the single turn resolution should be greater than or equal to a quarter of a turn. Such low resolution encoders are available at low cost, so that a low cost multi-turn absolute position registration may be achieved.

Within the scope of the present embodiment, a single turn encoder may refer to any device that measures the angular position of the shaft with a resolution of at least a quarter of a turn.

For the purpose of obtaining a more energetic pulse, one possibility is that the number of magnetic balls may be increased.

Figure 5:
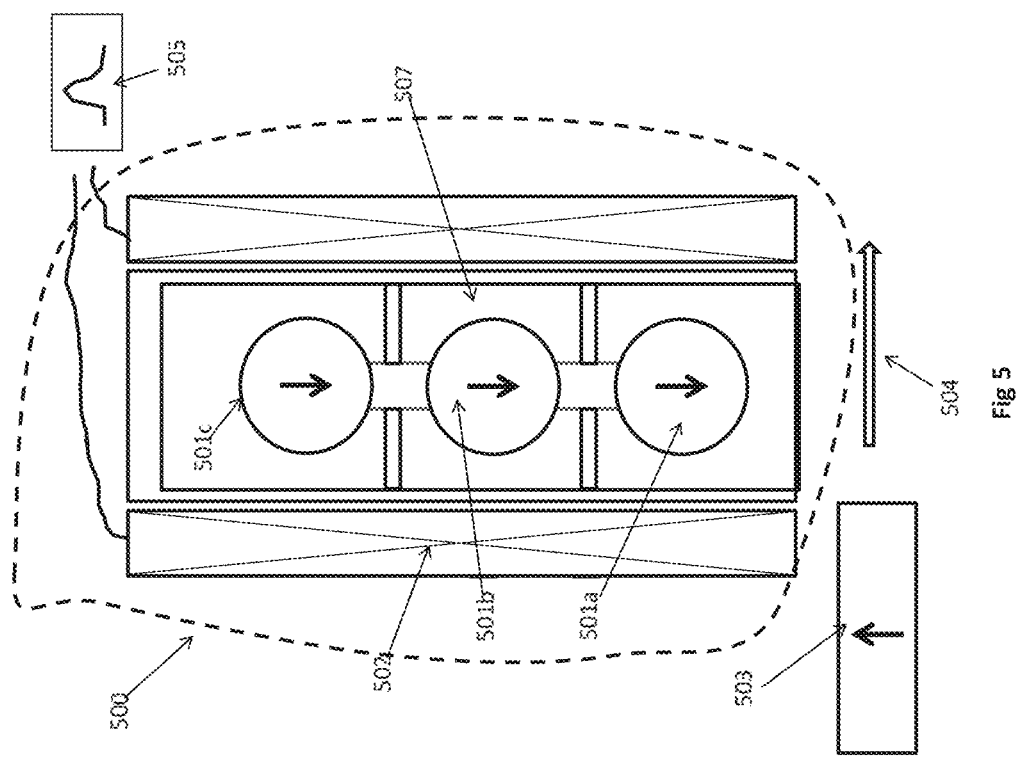
FIG. 5 illustrates an embodiment of the pulse generator with three balls or cylinders.

FIG. 5 is a schematic drawing showing a pulse generator according to a further embodiment of the present invention which is implemented with three magnetic balls. The function of the pulse generator is similar to that of the pulse generator described above in reference to FIG. 1.

Three magnetic balls 501a, 501b and 501c are confined in cavity 507 and kept at a distance from their neighbors by spacers 506a and 506b. When magnet 503 moves in the direction of arrow 504 the magnetic balls abruptly turn and produce an electric pulse in coil 502.

Using three balls, a longer coil enclosing all balls can be built, thus allowing a greater number of wire turns, resulting in a pulse of higher energy.

It will be apparent that more than three balls may also be used.

The above embodiments refer to the magnetic elements as balls of magnetic material. However, as already pointed out, it will be apparent that other shapes may be used, and these may include cylinders and parallelepipeds, which may be used according to the same principle. Round shapes such as balls or cylinders may provide a smoother operation, however other shapes may be used according to the application needs.

The embodiments of the invention described in FIGS. 2, 3 and 4 are applicable for the registration of the rotation of a shaft or any rotating element.

Embodiments of the present invention may be used to register the position of a linear moving element.

Figure 6:
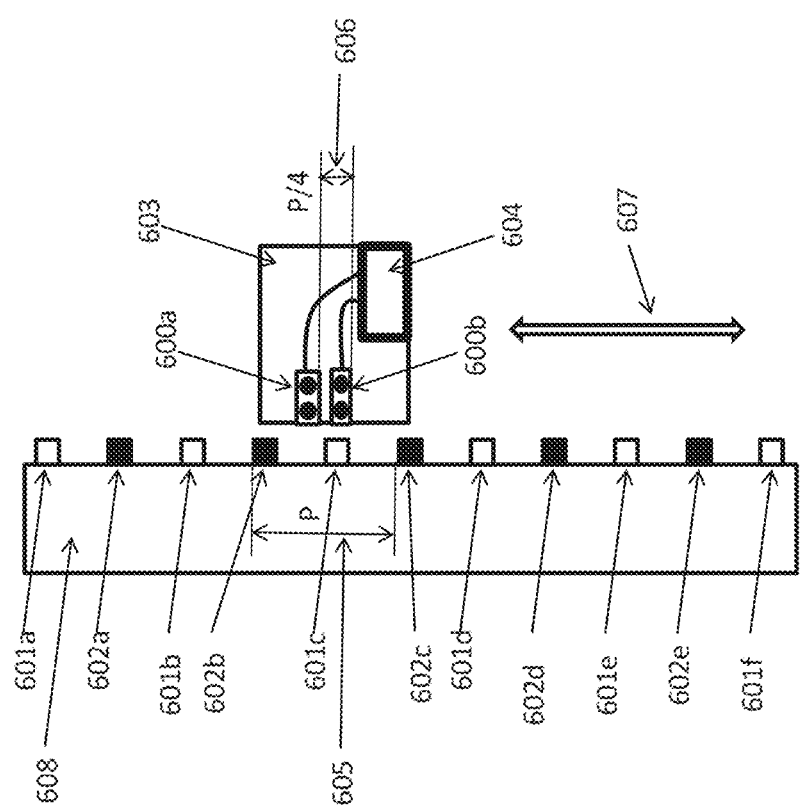
FIG. 6 illustrates an embodiment to register the position of a linearly sliding element.

Reference is now made to FIG. 6, which is a schematic diagram showing a linear motor and a linear embodiment of the present invention for registering the position of a linear moving element, using the same principle as shown in FIG. 3 above and using the pulse generator of FIG. 1.

A moving element 603 slides along a path or rail parallel to a static element 608, in the direction indicated by arrow 607. On the static element, a number of permanent magnets, 601a-601f and 602a-602e, are aligned and disposed at regular intervals. Successive permanent magnets along the path or rail are of alternating polarities. These magnets may be magnetized in a direction perpendicular to that of the sliding path of the moving element. Magnets 601a-601f have for example a north pole facing moving element 603, and magnets 602a-602e have a south pole facing moving element 603. Magnets are disposed at regular intervals indicated by pitch p as the distance between two magnets of the same polarity, and indicated by arrow 605.

On the moving element 603 are affixed two pulse generators 600a and 600b according to the present embodiments. These pulse generators may be connected to an electronic interface 604, for example including a processor and a non-volatile memory. The two pulse generators 600a and 600b may be separated by a quarter of the pitch p in the direction of movement, as indicated by arrow 606, and are positioned to move in proximity with the magnets 601a-601f and 602a-602e. The same counting method as described relative to the embodiment of FIG. 3 may be used to register the position of the moving element 603 with a quarter of period resolution. In this linear embodiment, a pitch length serves the same role as a turn of the shaft of FIG. 3.

In a variation, the alternating magnets may be placed on the moving element and one or more pulse generators may be placed on the rail or path.

The embodiment principle shown in FIG. 6 may thus provide a system able to measure the linear displacement of the moving element 603 with a quarter of pitch resolution.

Figure 7:
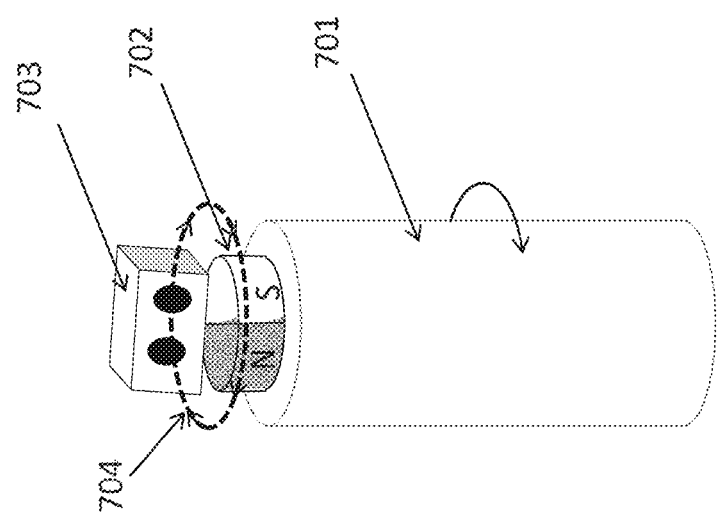
FIG. 7 shows an embodiment where the pulse generator is activated by a rotating magnet.

Reference is now made to FIG. 7, which schematically illustrates an embodiment of the present invention in which a pulse generator of the kind shown in FIG. 1 is activated by a rotating magnet disk.

On the extremity of a rotating shaft 701 is fixed a magnetic disk 702 diametrically magnetized. A pulse generator according to this invention 703 is placed in proximity with the rotating magnetic disk 703.

The magnetic disk 703 creates a magnetic field in the direction shown by the dotted line 704. This magnetic field traverses the pulse generator 703. Whenever the shaft 701 rotates, the magnet disk 702 also rotates and the direction of the magnetic field also changes direction, and thus activates the pulse generator 703.

The pulse generator may be used in various applications where a small amount of energy is required, and the use of battery may accordingly be avoided.

Figure 8:
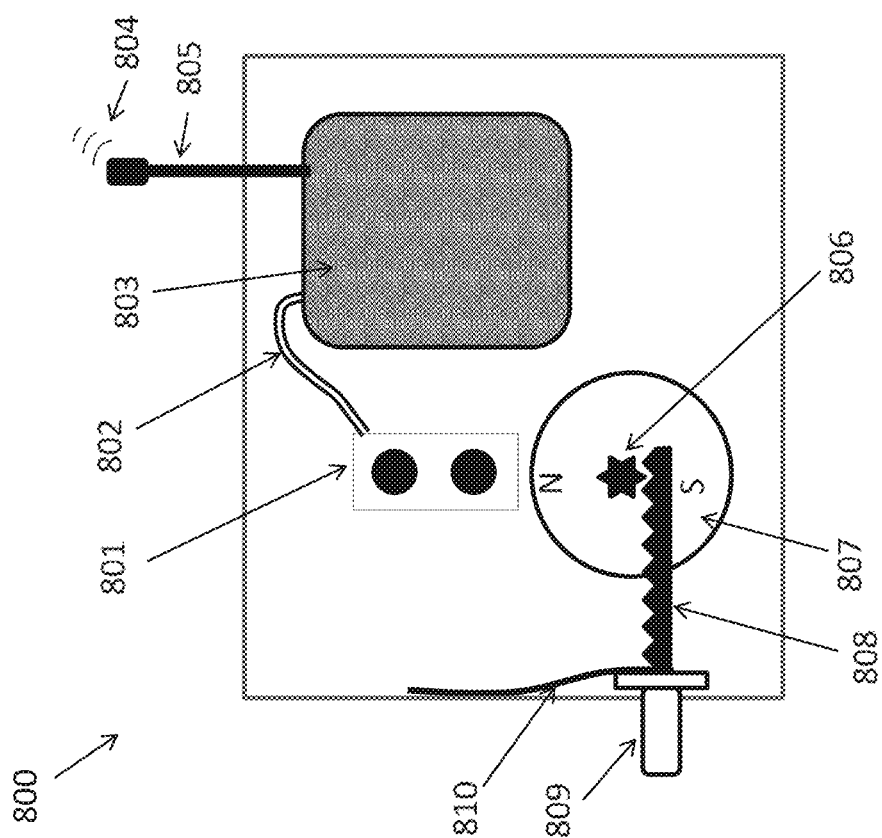
FIG. 8 shows a pulse generator application for a remote control device.

An example of such an application is shown in FIG. 8 as a remote control device for appliances. Such a remote control device may be used for example as a wireless light switch. A further application is for an opening detector, say as a door or window opening detector, for example as part of a security system, or simply to switch lights and other systems on or off when a person enters or leaves premises.

The remote control device 800 includes a pulse generator 801 according to the present embodiments, activated by a magnetic disk 807 located in proximity thereto. The magnetic disk 807 is rotated by half a turn due to operation of button or microswitch 809, which in turn operates a rack 808 and pinion 806 on the disk. Upon rotation, the south pole of the disk magnet approaches the pulse generator and creates a first pulse. When the button 809 is released, spring 810 restores button 809 to its starting position and the disk magnet returns to its original position with the north pole in proximity with the pulse generator 801, generating a second pulse.

The energy of the two pulses may be transferred to a radio emitter 803 through electrical wires 802. The radio emitter 803 then emits a coded radio signal, schematically indicated at 804, which is transmitted by antenna 805.

The coded signal may be received directly by the appliance to control the appliance, or switch on a light etc. Alternatively the signal may be received by an internet connected device to control internet connected devices or to provide data.

The mechanical system using rack 808 and pinion 806 is shown here as an example. It will be understood that many mechanical and even magnetic arrangements may be designed, as well as alternative shapes of magnets. Mechanical systems and shapes may be designed to change, upon activation, the polarity of the magnet pole in proximity to the pulse generator.

It is expected that during the life of a patent maturing from this application many relevant actuation devices and transmitters will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the text is to be construed as if such a single embodiment is explicitly written out in detail. Conversely, various features of the invention, which are, for brevity, described in the context of a single embodiment, may also be provided separately or in any suitable subcombination or as suitable in any other described embodiment of the invention, and the text is to be construed as if such separate embodiments or subcombinations are explicitly set forth herein in detail.

Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A pulse generator comprising:
   a mounting configured to hold two bodies in proximity to each other;
   first and second magnetic elements movably held in said mounting, such that the magnetic elements align with each other in a first alignment in one of two stable states;
   a coil surrounding said magnetic elements in said mounting;
   a force application device for applying a force to said first magnetic element, said force being such as to cause said first magnetic element to break said first alignment and cause said first and second magnetic elements to realign in said second stable state, said second stable state being in a second alignment different from said first alignment, thereby to generate a pulse in said coil, wherein the magnetic elements comprise a row of at least two magnetic balls confined in at least one cavity in said mounting, and wherein in both stable positions each magnetic ball aligns magnetically with a neighboring magnetic ball in said row.

2. The pulse generator of claim 1, wherein said force application device is configured to provide a magnetic field which is misaligned with said first magnetic element, thereby applying said force.

3. The pulse generator of claim 2, wherein said force application device comprises a third magnetic element.

4. The pulse generator of claim 3, wherein said first, second and third magnetic elements are respectively permanent magnets.

5. The pulse generator of claim 1, wherein each of said two stable states comprises an opposite magnetic field orientation, and wherein intermediate positions between said two stable states have higher potential energy than the potential energy of the stable positions.

6. The pulse generator according to claim 1, wherein the force application device is configured to progressively apply said magnetic field to said first magnetic element.

7. The pulse generator of claim 1, having a plurality of magnetic balls in said row in successive odd and even positions, and wherein the two stable positions are:
   a) a north magnetic hemisphere of a respective ball at an odd row position facing a south magnetic hemisphere of a ball at an even row position; and
   b) a south magnetic hemisphere of a ball at an odd row position facing a north hemisphere of a ball at an even row position.

8. The pulse generator according to claim 1, further comprising a counter, wherein the coil is connected to said counter to enable said counter to count and store a number of pulses, or further comprising a transmitter, wherein the coil is connected to said transmitter to transmit a signal in response to one or more of said pulse.

9. The pulse generator of claim 8, being within a remote controller, said signal being configured to cause operation of a remotely located device, said signal being configured for a local radio network.

10. The pulse generator of claim 1, wherein said force application device is part of a measurement system for measuring linear movement of a moving element along a track, or said force application device comprises a plurality of magnets evenly spaced along said moving element, or said force application device comprises a plurality of magnets evenly spaced along said track.

11. The pulse generator of claim 10, wherein said plurality of magnets are of alternating polarity.

12. A device for measuring linear motion of a moving part on a track; comprising the pulse generator of claim 1, wherein the mounting is located on said moving part and said force application device comprises a plurality of alternately polarized magnets evenly spaced along said track.

13. The pulse generator of claim 1, wherein the force application device comprises a rotatable disk surface facing said mounting.

14. A pulse generator comprising:
   a mounting configured to hold two bodies in proximity to each other;
   first and second magnetic elements movably held in said mounting, such that the magnetic elements align with each other in a first alignment in one of two stable states;
   a coil surrounding said magnetic elements in said mounting;
      a force application device for applying a force to said first magnetic element, said force being such as to cause said first magnetic element to break said first alignment and cause said first and second magnetic elements to realign in said second stable state, said second stable state being in a second alignment different from said first alignment, thereby to generate a pulse in said coil wherein said first and second magnetic elements comprise an ordered row of at least two magnetic cylinders magnetized across their length and confined in at least one cavity, and wherein in both stable positions each magnetic cylinder aligns with a neighboring magnetic cylinder in said row.

15. The pulse generator according to claim 14, having a plurality of said magnetic cylinders in said row in successive odd and even positions, and wherein the two stable positions are:
   a) a north magnetic half of a cylinder in an odd row position facing a south magnetic half of a cylinder at an even row position; and
   b) a south magnetic half of a cylinder at an odd row position facing a north magnetic half of a cylinder at an even row position.

16. A pulse generator comprising:
   a mounting configured to hold two bodies in proximity to each other;
   first and second magnetic elements movably held in said mounting, such that the magnetic elements align with each other in a first alignment in one of two stable states;
   a coil surrounding said magnetic elements in said mounting;
      a force application device for applying a force to said first magnetic element, said force being such as to cause said first magnetic element to break said first alignment and cause said first and second magnetic elements to realign in said second stable state, said second stable state being in a second alignment different from said first alignment, thereby to generate a pulse in said coil, wherein the force application device is part of a rotating element, such that said pulse generator counts rotations of said rotating element, and said force application device comprises two oppositely aligned magnets circumferentially separated on said rotating element.

17. The pulse generator of claim 16, combined with a second pulse generator aligned with said force application device.

18. The pulse generator of claim 16, further comprising an electronic interface operated by said electric pulse.

19. The pulse generator of claim 18, wherein at each electrical pulse the electronic interface is configured to carry out the actions of:
   a) reading from a memory a previously stored position of the moving element;
   b) calculating an increment or decrement;
   c) updating a current position of the element; and
   d) storing the current position of the element.

20. A device for measuring rotation of a shaft comprising:
   a) a pulse generator comprising:
   a mounting configured to hold two bodies in proximity to each other;
   first and second magnetic elements movably held in said mounting, such that the magnetic elements align with each other in a first alignment in one of two stable states;
   a coil surrounding said magnetic elements in said mounting;
   a force application device for applying a force to said first magnetic element, said force being such as to cause said first magnetic element to break said first alignment and cause said first and second magnetic elements to realign in said second stable state, said second stable state being in a second alignment different from said first alignment, thereby to generate a pulse in said coil; and b) a rotating shaft; and wherein said force application device is located on said rotating shaft to generate pulses in accordance with rotation of said rotating shaft, said force application device comprising two oppositely aligned magnets circumferentially separated on said rotating shaft.

21. The device of claim 20, further comprising a second pulse generator aligned with said force application device.

22. The device of claim 20, further comprising a single turn encoder to measure the angular position of the rotating shaft.

* * * * *